United States Patent [19]

Bickford et al.

[11] Patent Number: 4,939,570

[45] Date of Patent: Jul. 3, 1990

[54] HIGH POWER, PLUGGABLE TAPE AUTOMATED BONDING PACKAGE

[75] Inventors: Harry R. Bickford, Ossining; Lawrence S. Mok, Yorktown Heights; Michael J. Palmer, Walden, all of N.Y.

[73] Assignee: International Business Machines, Corp., Armonk, N.Y.

[21] Appl. No.: 223,580

[22] Filed: Jul. 25, 1988

[51] Int. Cl.$^5$ .................. H01L 23/02; H01L 23/12; H01L 23/48; H01L 29/44
[52] U.S. Cl. ........................... 357/81; 357/69; 357/74
[58] Field of Search ............... 357/69, 70, 72, 74, 357/81

[56] References Cited

U.S. PATENT DOCUMENTS

| | | | |
|---|---|---|---|
| 3,594,619 | 7/1971 | Kamoshida et al. | 317/234 |
| 4,099,200 | 7/1978 | Koutalides | 357/69 |
| 4,326,238 | 4/1982 | Takeda et al. | 361/386 |
| 4,607,276 | 8/1986 | Butt | 357/79 |
| 4,736,236 | 4/1988 | Butt | 357/70 |
| 4,819,041 | 4/1989 | Redmond | 357/80 |

FOREIGN PATENT DOCUMENTS

| | | | |
|---|---|---|---|
| 0193127 | 9/1986 | European Pat. Off. | 357/69 |
| 1401655 | 7/1975 | United Kingdom | 357/69 |

*Primary Examiner*—Rolf Hille
*Assistant Examiner*—David M. Ostrowski
*Attorney, Agent, or Firm*—Perman & Green

[57] ABSTRACT

A TAB package is described which includes a flexible dielectric film with an outer edge, back and front faces and an aperture therein. The front face, as is conventional, is provided with a plurality of beam leads, which leads extend into the aperture and connect to a semiconductor chip. Thermally conductive body means is provided which has a well formed therein, the well defined by a lip comprising the outer rim of the body means. The back face of the semiconductor chip is thermally connected to the thermally conductive body means and the flexible dielectric film is formed to conform to the surface of the well and to extend over its rim whereby the beam leads also conform to the well and rim structure. The beam leads are thereby made available for electrical connection in the vicinity of the rim. Means are also provided for attaching the outer edge of the film to the thermally conductive body means so as to enable flexure of the film in the event of differential expansion or contraction at connection points.

9 Claims, 2 Drawing Sheets

HIGH POWER, PLUGGABLE TAPE AUTOMATED BONDING PACKAGE

FIELD OF THE INVENTION

This invention relates to integrated circuit chip packages and more particularly to a tape automated bonding package adapted for use with high power dissipation semiconductor chips.

BACKGROUND OF THE INVENTION

The prior art is replete with various package configurations for semiconductor chips. In recent years, the cost of such packages has, in many cases, out distanced the cost of the chips. An inexpensive packaging technique known as "Tape-Automated-Bonding" (TAB) packaging has come into being and has been especially useful with lower cost, low power dissipation integrated circuits. TAB packages employ a web of polymeric material, generally called a carrier tape, to carry beam-lead conductors which provide connections between the chip and the outside world. The carrier tape is incremented past a number of operating stations, one of which places a chip on an inner-cluster of beam-leads, which cluster is then bonded to connecting pads on the chip. The carrier tape is then incremented to a station where the active face of the chip, including the inner lead-bonds is coated with a passivating material. In conventional systems, the tape is then moved to a further station where the outer beam leads are registered with conductive pads on an underlying circuit board and connections are made therebetween.

TAB packaging is, by its nature, inexpensive. Its use, however, has been mainly restricted to low power dissipation circuits as it has been difficult to apply heat sinks to such structures while still maintaining the package's low cost characteristics.

In addition to its low cost, TAB packaging provides an important temperature compensation feature which is not readily apparent. The conventional TAB package is connected to the underlying circuit board only by its outer lead-bonds. Thus, if there is a difference in the expansion/contraction characteristics between the underlying circuit board and the tape carrier, the flexibility of the package enables it to cope with that phenomenon, thus avoiding bond ruptures which might occur in a more rigid packaging system.

One disadvantage of the TAB package is that it is not inherently pluggable (i.e. able to be plugged into a female connecter) without substantial alteration and/or modification of its configuration.

In U.S. Pat. No. 3,846,825 to Budde, a package is disclosed wherein a semiconductor chip is joined to metal patterns on an insulating flexible foil. The combination is mounted on a ceramic wafer which has an opening aligned with the chip. A conductive heat dissipator, on the reverse side of the ceramic wafer, makes contact with the non-active face of the chip—thereby providing a heat sink. In order to make the package "pluggable", the metal conductors on the foil are soldered to corresponding metal conductors extending from pins which pass through the ceramic wafer and are adapted to be inserted into a female connector. Utilization of the pin connections and the metallized support that carries the pins represent an undesirable added cost to the package.

In U.S. Pat. No. 4,147,889 to Andrews et al, another chip carrier arrangement is shown wherein a thin dielectric with beam conductors thereon is formed into a dish shaped receptacle. The chip contact pads are connected to these conductors by "flying" lead bonds. The receptacle has flexible flanges which are used to mount the combination on a circuit board. Since the package is held in place by relatively thin metallic flanges, its heat dissipation characteristics are limited. Furthermore, there is no teaching of any means for making the package pluggable.

In U.S. Pat. No. 4,132,856 to Hutchison et al, an integrated circuit package is described wherein a carrier tape/chip assembly is emplaced on a heat sink. The combination is then encapsulated with the outer bonds being available for interconnection. The encapsulation of the Hutchison et al package eliminates the flexibility features of the TAB package and makes the outer lead bonds much more susceptible to rupture in the event of differential expansion/contraction with interconnected lands on a circuit board.

Accordingly, it is an object of this invention to provide an improved TAB package which enables high power dissipation from an attached chip.

It is a further object of this invention to provide a TAB package which is pluggable.

It is another object of this invention to provide an improved TAB package which is adaptable to differential expansion/contraction at its interconnection points.

SUMMARY OF THE INVENTION

The present invention provides a TAB package which includes a flexible dielectric film with an outer edge, back and front faces and an aperture. The front face, as is conventional, is provided with a plurality of beam leads, which leads extend into the aperture and connect to a semiconductor chip. Thermally conductive body means is provided which has a well formed therein, the well defined by a lip comprising the outer rim of the body means. The semiconductor chip is thermally connected to the thermally conductive body means and the flexible dielectric film is formed to conform to the surface of the well and to extend over its rim whereby the beam leads also conform to the well and rim structure. The beam leads are thereby made available for electrical connection in the vicinity of the rim. Means are also provided for attaching the outer edge of the film to the thermally conductive body means so as to enable flexure of the film in the event of differential expansion or contraction at connection points.

DETAILED DESCRIPTION OF THE INVENTION

Figure 1:
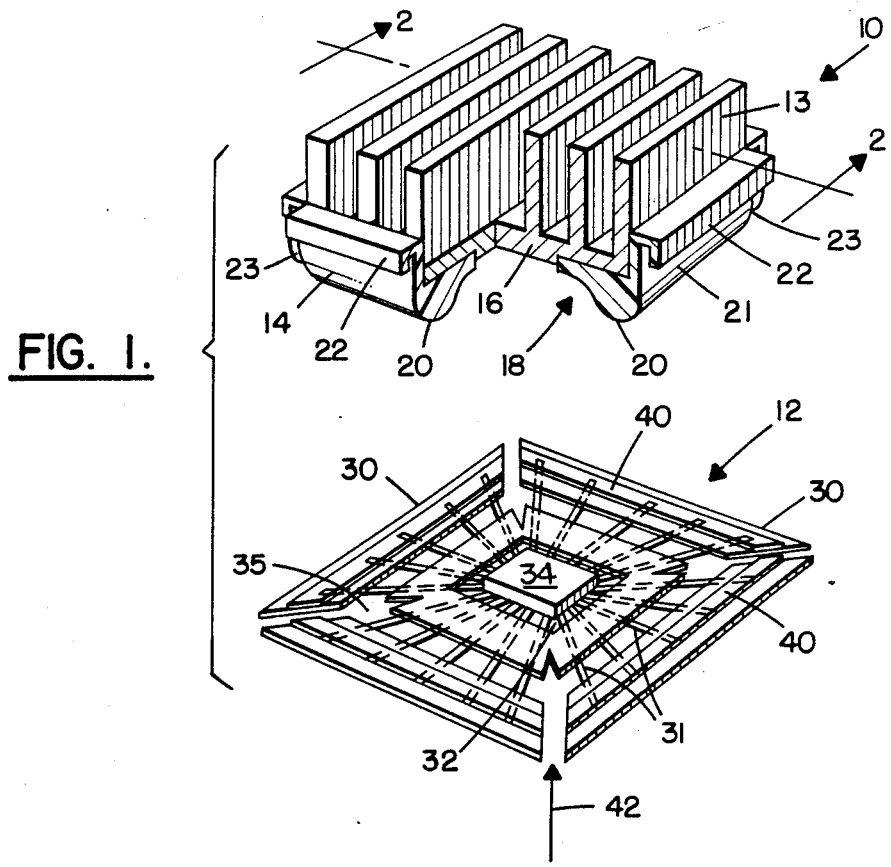
FIG. 1 is an exploded isometric view of the thermally conducting body means and TAB carrier/chip before assembly.
Figure 2:
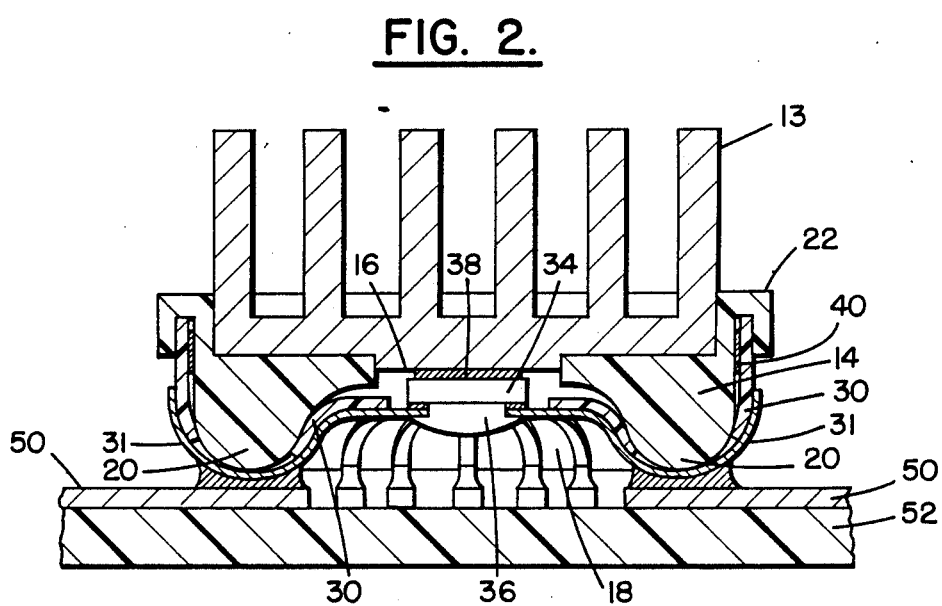
FIG. 2 is a section taken along line 2—2 of FIG. 1 after assembly and placement of the package on a circuit board.

Referring now to FIG. 1, an isometric view is shown of thermally conducting body 10 and tape carrier/chip combination 12 prior to assembly. FIG. 2 is a section taken through thermally conducting body 10 along line 2—2 after it has been assembled with tape carrier/chip assembly 12. Thermally conducting body 10 comprises a finned heat sink 13 which nests in and is supported by insulating base member 14. A portion of base member 14 has been cut away to enable its inner structure to be visualized.

Heat sink 13 has a downwardly extending portion 16 which mates with an opening through the central portion of base member 14. Base member 14 has a well area 18 formed into its lower surface such that its lower-most extremity forms a rim 20 about the well area. The upper surface of base member 14 has an opening in which heat sink 13 is seated. A grooved lip 22 is formed about the upper extremity of base member 14. The size of the grooved opening in lip 22 is slightly larger than the thickness of tape carrier 30. At each corner of base member 14, there is provided an opening 23 into well area 18. Openings 23 provide access for easy flux cleaning when the package is soldered to a printed circuit board.

A plurality of beam lead conductors 31 are affixed to the underside of tape carrier 30. The inner lead portions extend into opening 32 and are bonded to chip 34 thereby making electrical connection therewith. The outer portions of conductors 31 terminate prior reaching the outer extremities of tape carrier 30. An encapsulating material 36 covers the active face of chip 34 and passivates its connection points. Intermediate areas 35 have been removed from tape carrier 30 as to enable the bending of beam leads 31 about outer rim 20 when thermally conducting body 10 and tape carrier/chip assembly 12 are joined.

Prior to assembling tape carrier/chip assembly 12 with thermally conductive body 10, a layer of thermally conductive adhesive 38 is emplaced on the upper surface of chip 34 (see FIG. 2). In addition, an adhesive material 40 is placed around the periphery of tape carrier 30. It should be noted that corner portions of tape carrier 30 have been removed so as to create arms which may be bent or formed independently of each other.

To assemble the circuit package, a forming tool (not shown) is raised to contact the bottom surface of tape carrier/chip assembly 12 from the direction shown by arrow 42. As tape carrier/chip assembly 12 moves upwardly, the top surface of chip 34 and thermally conducting adhesive 38 come into contact with downwardly extending portion 16 of heat sink 13. Simultaneously, each of the arms of tape carrier 30 is formed about an associated rim area 20. The outer-most extremity of each arm and its adhesive layer 40 is thereby moved into contact with wall surface 21 of base member 14. Additionally, the edge of each of the arms is inserted into the respective grooved lip 22. Pressure is maintained on the assembly until cement 40 causes the tape carrier 30 to adhere to wall surface 21 of base member 14 and adhesive 38 causes chip 34 to adhere to portion 16 of heat sink 13.

As can be seen from FIG. 2, the only points of rigid interconnection between tape carrier/chip assembly 12 and thermally conductive body 10 are thermally conductive adhesive 38 and adhesive 40. Well portion 18 of base member 14 provides an offset so that chip 34 and its associated interconnections are kept well away from any supporting circuit board or conductive land areas. In FIG. 2, the circuit package is shown as being soldered to conductive lands 50 which are, in turn, supported by circuit board 52. Since tape carrier 30 is connected to base member 14 only by adhesive 40, should differential thermal expansion be experienced between circuit board 52 and any portion of the circuit package, tape carrier 30 is adapted to move relative to body 14 to relieve any stresses and avoid ruptures of the circuit interconnections.

Figure 3:
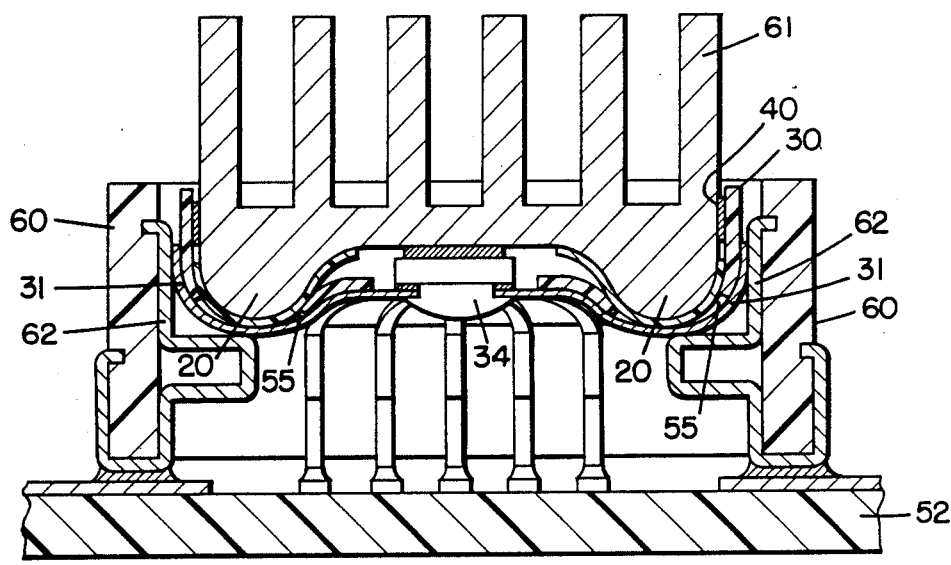
FIG. 3 is a section of a pluggable package embodying the invention wherein a unitary heat sink is employed.

Referring now to FIG. 3, the structure shown in FIG. 2 has been modified to include a unitary heat sink 61. In this instance, heat sink 61 has an identical external shape to the thermally conductive body 10 shown in FIGS. 1 and 2, but rather is comprised of a single metal substrate. As a result, heat sink 60 is somewhat heavier and but provides more efficient thermal dissipation properties. An additional layer of insulating material 55 encompasses rim area 20 and acts to isolate conductors 31 from metal heat sink 60. In addition, in lieu of interconnecting conductors 31 directly to printed circuit board 52, a female socket 60 is shown which is provided with a plurality of contacts 62. When the circuit package assembly is inserted into socket 60, conductors 31 connect to contacts 62 and thereby enable communication with chip 34. If should be noted, that the structures shown in FIGS. 2 and 3 both provide pluggable TAB packages.

Figure 4:
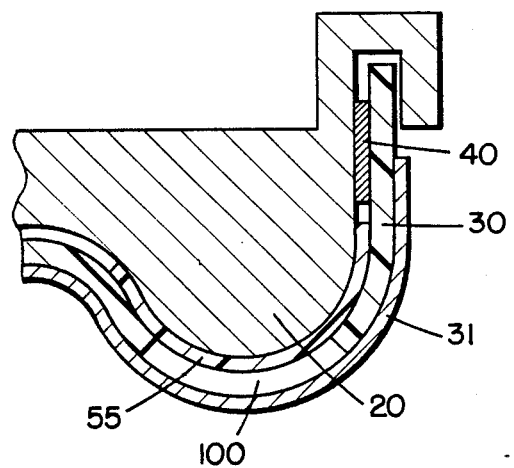
FIG. 4 is a section of a portion of the package showing a modification to enable relative movement between the thermally conducting body and the TAB carrier.

In FIG. 4, a modification is illustrated to the circuit packages shown in FIGS. 1-3 which provides for greater relative movement between the tape carrier/chip assembly 12 and thermally conducting body 10. In this case, a small space 100 is deliberately left between beam leads 31 and rim 20 (including insulating material 55) when tape carrier 30 and beam leads 31 are formed thereover. This space provides for greater relative movement between the conductor carrying elements of the circuit package and the heat sink.

It is to be understood that the foregoing description is only illustrative of the invention. Various alternatives and modifications can be devised by those skilled in the art without departing from the invention. Accordingly the present invention is intended to embrace all such alternatives modifications and variances which fall within the scope of the appended claims.

We claim:
1. A circuit package comprising:
a flexible dielectric film having an outer edge, back and front faces and an aperture therein, said front face provided with a plurality of beam leads affixed thereto, said beam leads extending into said aperture;
a semiconductor chip positioned in said aperture and having back and front faces, said front face having electrical contacts connected to said beam leads, said chip oriented such that it extends from said back face of said dielectric film;
thermally conductive body means having a surface defined by a well substantially circumscribed by an outer rim, the back face of said semiconductor chip thermally connected to said thermally conductive body means and said back face of said flexible dielectric film substantially following said surface, whereby said beam leads are made available for electrical connection in the vicinity of said outer rim; and
means for attaching said outer edge of said film to said thermally conductive body means outboard of said outer rim to enable flexure of said beam leads in the event of differential expansion or contraction at a point of electrical connection thereto.

2. The invention of claim 1 wherein a portion of said dielectric film which follows said surface in the region of said outer rim is removed leaving said beam leads in contract with said outer rim.

3. The invention of claim 1 wherein said thermally conductive body means comprises:
   a first insulating body portion which includes said well; and
   a second conductive body portion mating with said first body portion and having an extension therethrough which is thermally connected to said chip.

4. The invention of claim 3 wherein said attachment means includes a grooved lip arranged about an outer wall of said well for receiving the outer edge of said flexible dielectric film.

5. The invention of claim 4 wherein said attachment means further comprises adhesive residing between the said outer edge of said film and said outer wall of said well.

6. The invention of claim 1 wherein said thermally conductive body means comprises a conductive, finned body thermally connected to said chip.

7. The invention of claim 6 further comprising:
   an insulating material covering said outer rim and wherein the portion of said dielectric film which follows said surface in the region of said outer rim is removed to allow said beam leads to contact said insulating material.

8. The invention of claim 7 wherein said attachment means further comprises adhesive residing between said outer edge of said film and said outer wall of said well.

9. The invention of claim 7 wherein a space remains between said beam leads and said outer rim to enable relative movement therebetween.

* * * * *